(12) United States Patent
Choi

(10) Patent No.: US 7,468,300 B2
(45) Date of Patent: Dec. 23, 2008

(54) SEMICONDUCTOR DEVICE HAVING HIGH VOLTAGE MOS TRANSISTOR AND FABRICATION METHOD THEREOF

(75) Inventor: Yong Keon Choi, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 465 days.

(21) Appl. No.: 11/320,859

(22) Filed: Dec. 30, 2005

(65) Prior Publication Data
US 2006/0148183 A1    Jul. 6, 2006

(30) Foreign Application Priority Data
Dec. 31, 2004    (KR) .................. 10-2004-0117677

(51) Int. Cl.
*H01L 21/8234*    (2006.01)
(52) U.S. Cl. .................. 438/275; 438/591; 438/981; 257/E21.427
(58) Field of Classification Search .......... 438/275, 438/591, 981; 257/E21.427
See application file for complete search history.

(56) References Cited

U.S. PATENT DOCUMENTS 6,818,514 B2 * 11/2004 Kim et al. .................. 438/275
7,129,137 B2 * 10/2006 Matsumoto ................ 438/275

* cited by examiner

*Primary Examiner*—Chandra Chaudhari
(74) *Attorney, Agent, or Firm*—Lowe Hauptman Ham & Berner LLP (57) ABSTRACT

A semiconductor device having a high voltage MOS transistor. The device includes a gate oxide layer disposed between a gate electrode and a substrate on an active area and having relatively thick portions at edges thereof. A fabrication method includes forming on the substrate is a nitride layer having an opening in a high voltage region. An oxide layer is deposited over the substrate and anisotropically etched to remain only on sidewalls of the opening. A first gate oxide layer is formed on the substrate in the opening, and the nitride layer is removed. Then a second gate oxide layer is formed over the substrate such that the second gate oxide layer has a relatively thinner thickness than the first gate oxide layer. Gate electrodes are then formed in the high voltage region and the low voltage region.

3 Claims, 9 Drawing Sheets

FIG. 1

PRIOR ART

FIG. 2

PRIOR ART

FIG. 3

PRIOR ART

FIG. 4

PRIOR ART

FIG. 5

PRIOR ART

SEMICONDUCTOR DEVICE HAVING HIGH VOLTAGE MOS TRANSISTOR AND FABRICATION METHOD THEREOF

CROSS REFERENCE TO RELATED APPLICATIONS

This U.S. non-provisional application claims priority under 35 U.S.C. §119 from Korean Patent Application No. 2004-117677, which was filed in the Korean Intellectual Property Office on Dec. 31, 2004, the contents of which are incorporated by reference herein in its entirety.

BACKGROUND OF THE INVENTION

1. Field of the Invention

The present invention relates generally to semiconductor integrated circuit (IC) technology and, more particularly, to a semiconductor device having a high voltage MOS transistor allowing an increase in breakdown and fabricated with a more simple process.

2. Description of the Related Art

Dramatically growing semiconductor IC technology allows a variety of devices, such as transistors, capacitors and resistors, to be integrated in a single chip. Furthermore, various approaches to effectively embody such devices in the chip have been continuously studied and introduced in the art.

For example, modern silicon device technology attempts to combine logic technology represented by a CPU (central processing unit) for data processing and memory technology for data storing. Furthermore, such attempts intend to combine analog technology and RF technology together with logic and memory technologies.

In general, a transistor holds an important position common to logic and memory technologies. However, logic technology considers current drivability, whereas memory technology does reduced leakage current and improved breakdown voltage. Hence, it is required to effectively embody MOS (metal oxide semiconductor) transistors with different gate dielectrics in thickness on a single chip.

FIGS. 1 to 4 are cross-sectional views showing a method of fabricating a conventional semiconductor device having a high voltage MOS transistor. In the drawings, a reference character "A" indicates a region where a high voltage MOS transistor is formed. Hereinafter, this region will be referred to as a high voltage region. Similarly, a reference character "B" indicates a region where a low voltage MOS transistor is formed and which will be referred to as a low voltage region.

Figure 1:
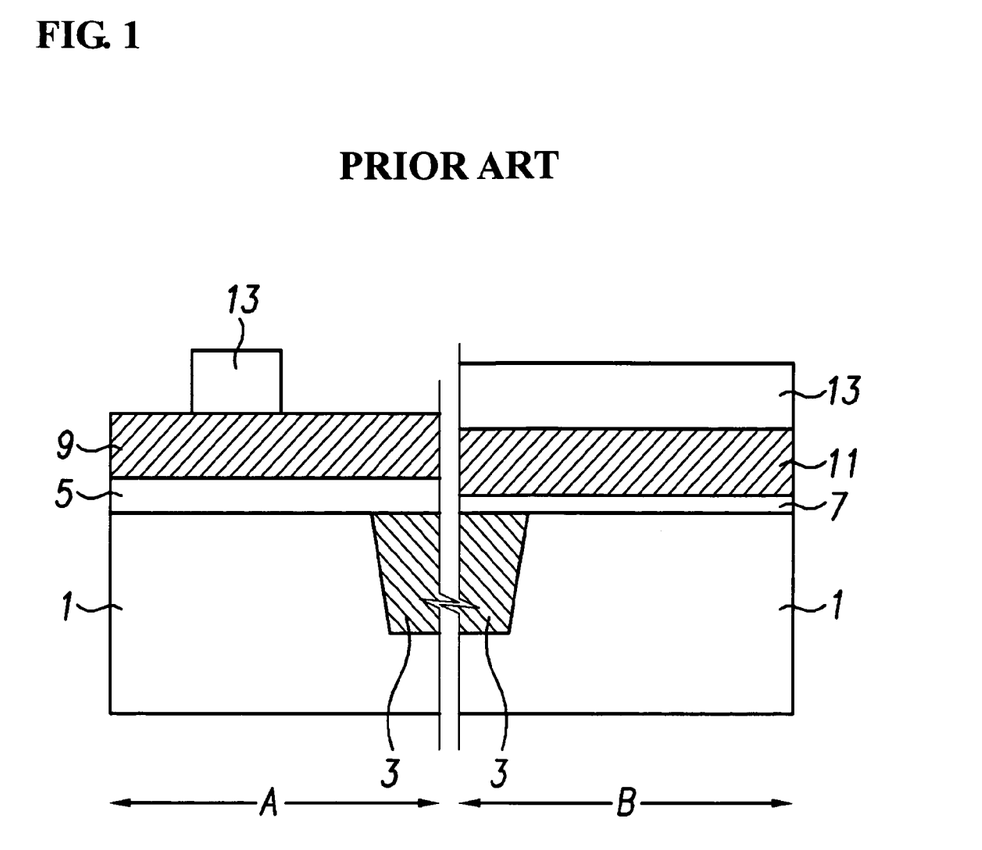
FIGS. 1 to 4 are cross-sectional views showing a method of fabricating a conventional semiconductor device having a high voltage MOS transistor.

Referring to FIG. 1, a field area 3 is formed in a semiconductor substrate 1, defining an active area. In most cases, the substrate 1 is selectively etched to form a trench for the field area 3. Suitable insulating material is deposited to fill the trench and then planarized.

Next, gate oxide layers are formed on the substrate 1. That is, a relatively thick first gate oxide layer 5 is formed in the high voltage region (A), and a relatively thin second gate oxide layer 7 is formed in the low voltage region (B). Well-known various techniques may be used for forming the gate oxide layers 5 and 7 with different thickness. For example, a nitride layer is formed on the entire substrate 1 and removed from the high voltage region (A) by using typical photo etching process. Then the thick gate oxide layer 5 is thermally grown in the high voltage region. The remaining nitride layer is removed from the low voltage region (B), and the thin gate oxide layer 7 is thermally grown in the low voltage region.

Subsequently, a gate conductive layer 9, 11 is formed on the gate oxide layer 5, 7, and a first photoresist pattern 13 is formed thereon by using typical photo process. The first photoresist pattern 13 selectively exposes the high voltage region (A), fully covering the low voltage region (B).

Figure 2:
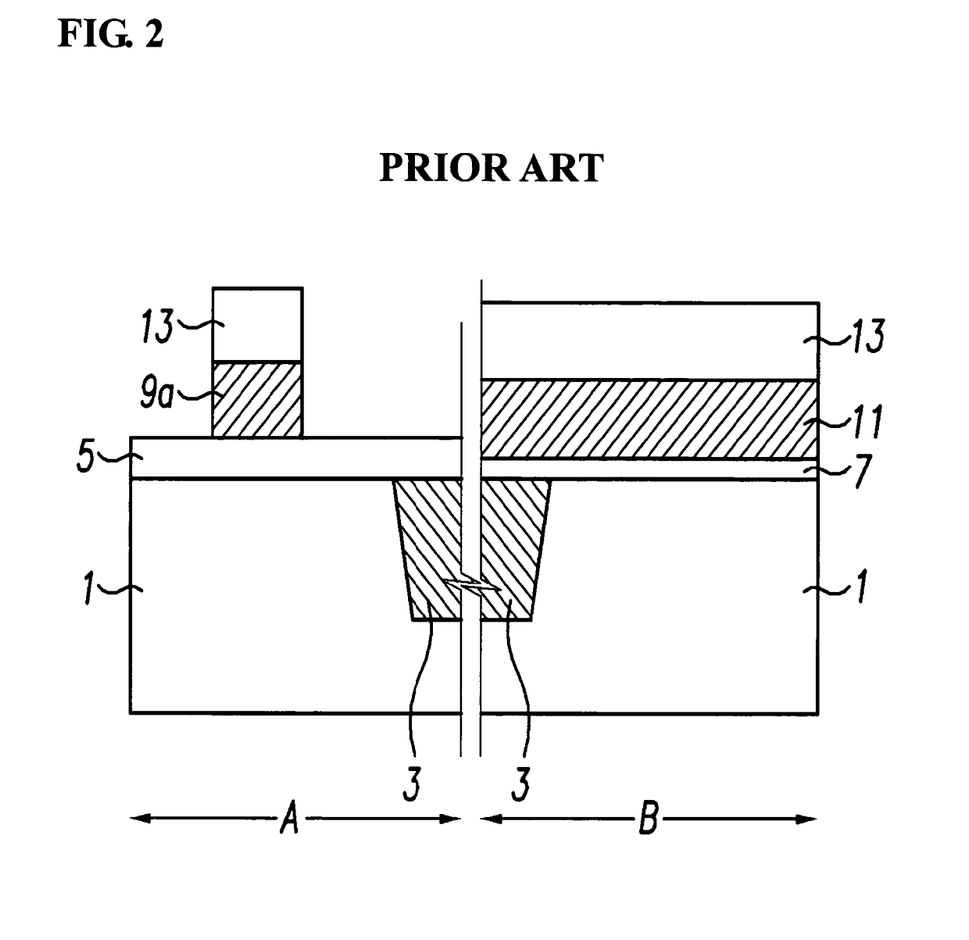

Next, referring to FIG. 2, the gate conductive layer 9 in the high voltage region (A) is selectively etched until the first gate oxide layer 5 is exposed. Here, the first photoresist pattern 13 is used as an etch mask. As a result, a first gate electrode 9a is formed in the high voltage region (A).

Figure 3:
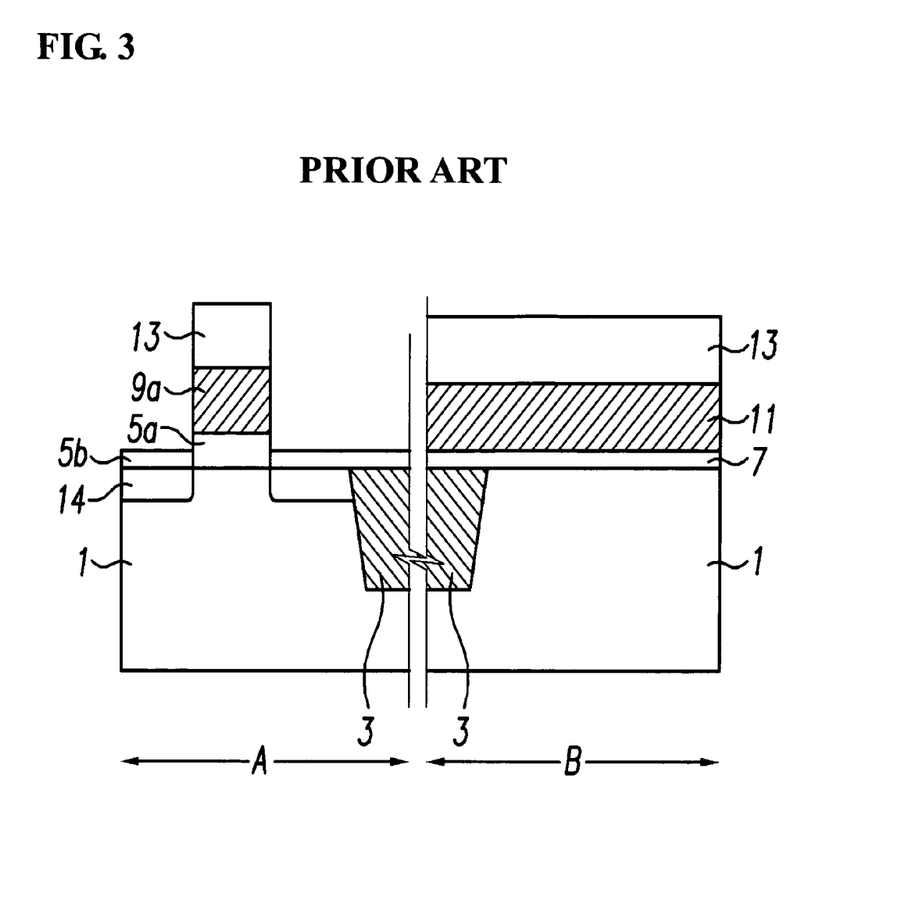

Next, referring to FIG. 3, the first gate oxide layer 5 is selectively etched using the first photoresist pattern 13 as an etch mask. Here, the first gate oxide layer 5 may partially remain after etching. As a result, the first gate oxide layer 5 is composed of an unetched portion 5a under the first gate electrode 9a and a partially etched portion 5b remaining on the substrate 1. The remaining gate oxide layer 5b may act as a buffer layer during the subsequent ion implanting process. A low doping part 14 of a source/drain is formed in the substrate 1 through a shallow ion implantation.

Figure 4:
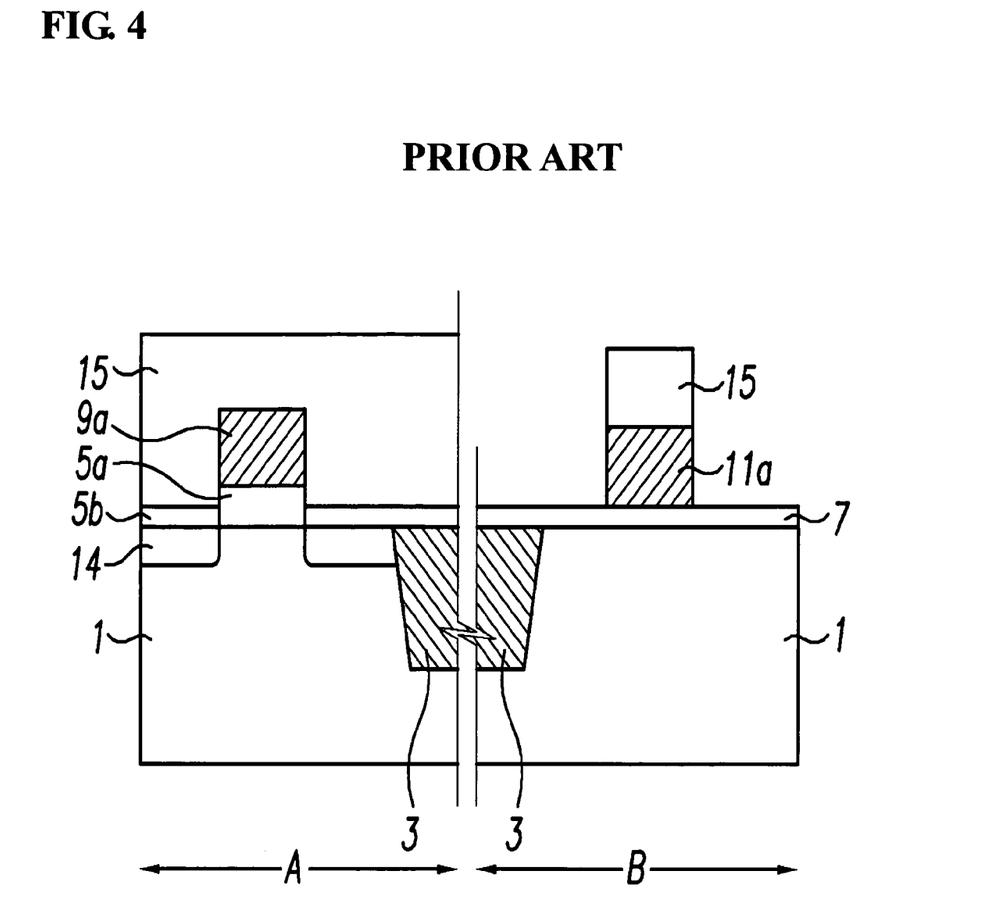

Next, referring to FIG. 4, the first photoresist pattern 13 is removed, and a second photoresist pattern 15 is formed instead. The second photoresist pattern 15 selectively exposes the low voltage region (B), fully covering the high voltage region (A). Then, the gate conductive layer 11 is selectively etched using the second photoresist pattern 15 as an etch mask, so a second gate electrode 11a is formed in the low voltage region (B).

Thereafter, spacers are formed on sidewalls of the gate electrodes 9a and 11a, and a high doping part of the source/drain is formed in the substrate 1.

Figure 5:
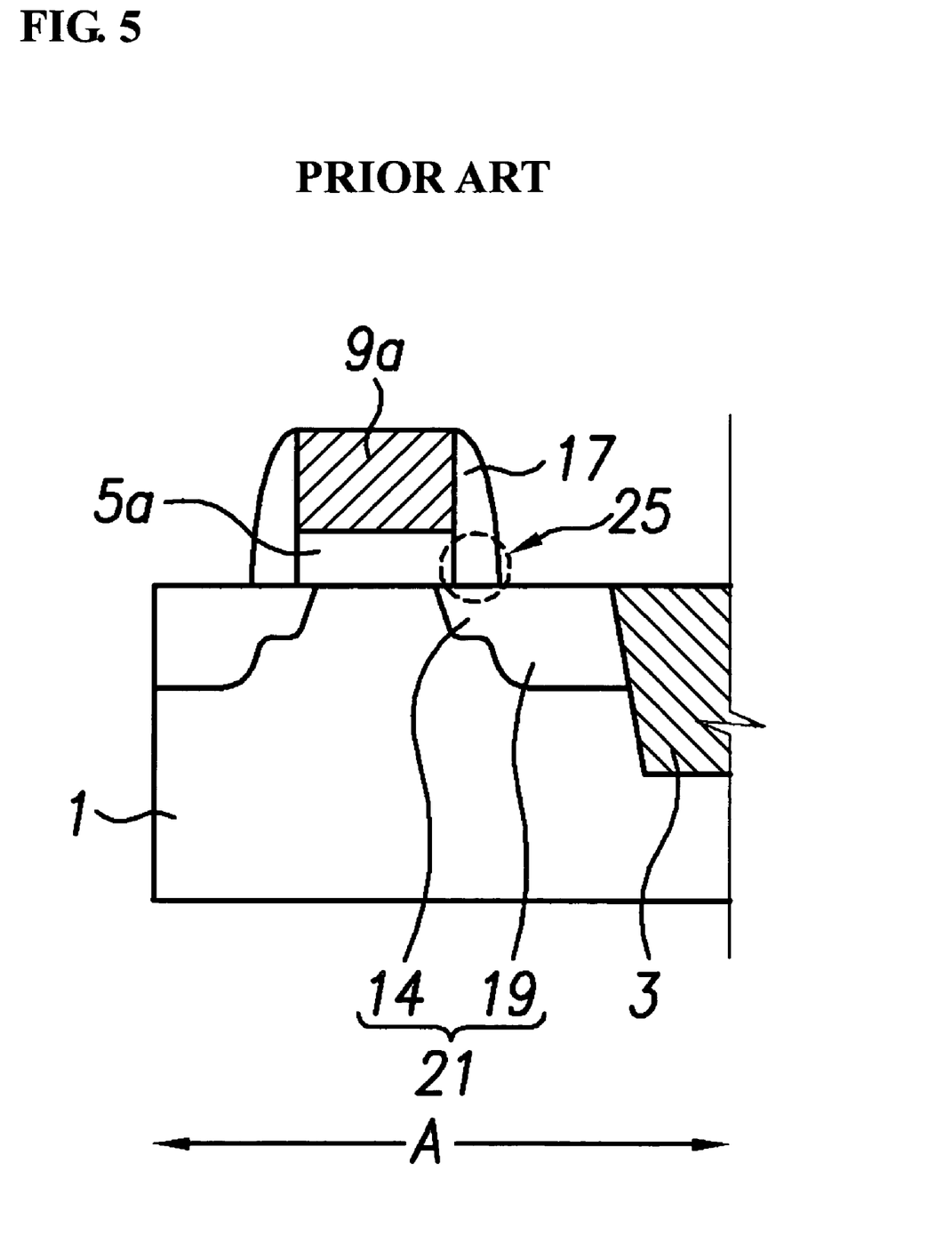
FIG. 5 is a cross-sectional view showing a conventional MOS transistor in a high voltage region.

FIG. 5 shows, in a cross-sectional view, a conventional MOS transistor in the high voltage region.

Referring to FIG. 5, the spacer 17 is formed on the sidewall of the gate electrode 9a, and the source/drain 21 is formed in the substrate 1. The source/drain 21 has the low doping part 14 and the high doping part 19.

As discussed hereinbefore, to fabricate MOS transistors in both the high and low voltage regions requires additional processes such as partial removal of the first gate oxide layer 5 in the high voltage region (A). Furthermore, undesirable breakdown may occur in a place 25 between the gate electrode 9a and the drain 21 due to high electric field applied thereto.

SUMMARY OF THE INVENTION

Exemplary, non-limiting embodiments of the present invention provide a semiconductor device having a high voltage MOS transistor allowing an increase in breakdown, and also provide a related fabrication method with a more simple process.

According to one exemplary embodiment of the present invention, the method comprises forming a field area in a semiconductor substrate so as to define an active area in a high voltage region and a low voltage region, forming a nitride layer on the substrate, the nitride layer having an opening in the high voltage region, depositing an oxide layer over the substrate, anisotropically etching the oxide layer such that the oxide layer remains only on sidewalls of the opening, forming a first gate oxide layer on the substrate in the opening, removing the nitride layer, forming a second gate oxide layer over the substrate such that the second gate oxide layer has a relatively thinner thickness than the first gate oxide layer, forming gate electrodes in the high voltage region and the low voltage region, and forming source/drain around the gate electrodes in the active area of the substrate.

In the method, the first gate oxide layer can have a thickness of 500~1500 Å and the second gate oxide layer can have a thickness of 50~300 Å. The method can further comprise, after the forming of the field area, forming a drift area in the substrate of the high voltage region.

According to one exemplary embodiment of the present invention, the semiconductor device comprises a semiconductor substrate having a field area defining an active area, a gate electrode disposed on the active area of the substrate, a gate oxide layer disposed between the gate electrode and the substrate on the active area, having relatively thick portions at edges thereof, and a source/drain formed around the gate electrode in the active area of the substrate.

The device can further comprise a drift area formed in the substrate to surround the source/drain. In the device, the gate oxide layer can have a thickness of 500~1500 Å.

DETAILED DESCRIPTION OF EXEMPLARY EMBODIMENTS OF THE INVENTION

An exemplary, non-limiting embodiment of the present invention will now be described more fully hereinafter with reference to the accompanying drawings. This invention may, however, be embodied in many different forms and should not be construed as limited to the exemplary embodiment set forth herein. Rather, the disclosed embodiment is provided so that this disclosure will be thorough and complete, and will fully disclose the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale.

Figure 6:
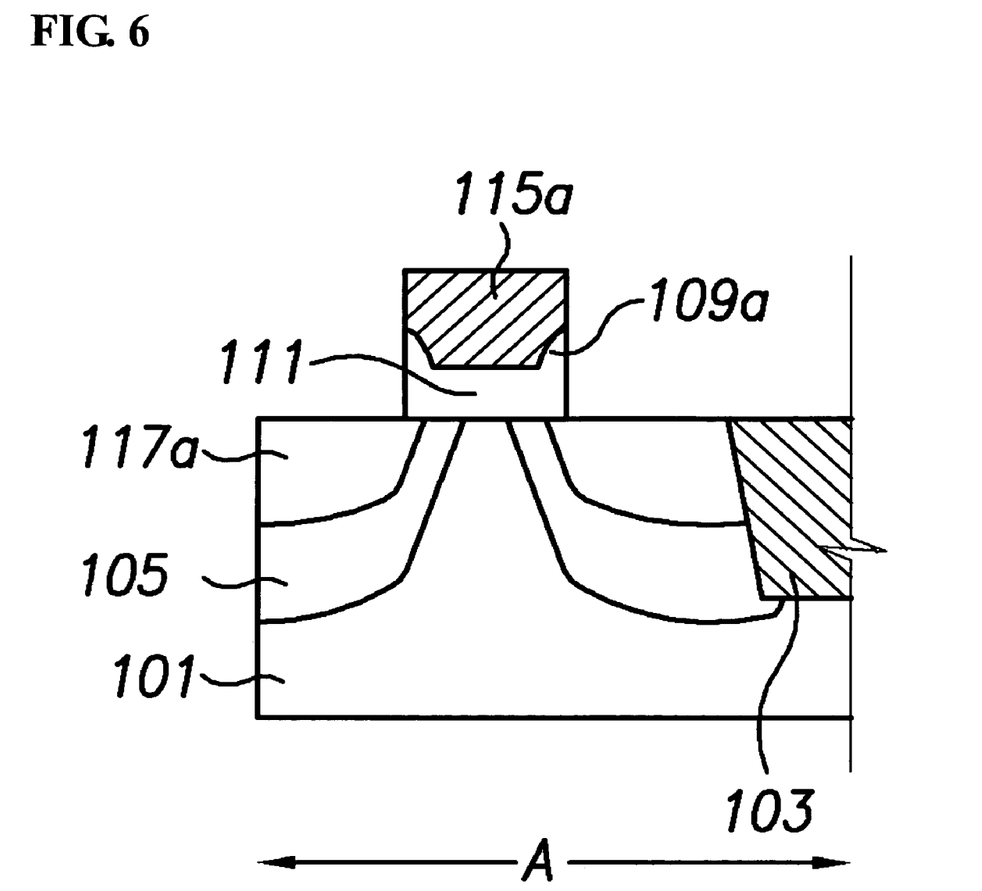
FIG. 6 is a cross-sectional view showing a MOS transistor in a high voltage region in accordance with an exemplary embodiment of the present invention.

FIG. 6 is a cross-sectional view showing a MOS transistor in a high voltage region in accordance with an exemplary embodiment of the present invention.

Referring to FIG. 6, a field area 103 is formed in a semiconductor substrate 101, defining an active area. A gate oxide layer 111 and a gate electrode 115a are disposed in a stack on the active area of the substrate 101, and a source/drain 117a is formed around the gate electrode 115a in the active area of the substrate 101. The source/drain 117a is surrounded with a drift area 105 in the substrate 101. The gate oxide layer 111 has relatively thick portions 109a at edges thereof. These thick portions 109a allow an increase in breakdown between the gate electrode 115a and the drain 117a.

FIGS. 7 to 11 are cross-sectional views showing a method of fabricating a semiconductor device having a high voltage MOS transistor in accordance with an exemplary embodiment of the present invention. Like previous drawings, reference characters "A" and "B" indicate a high voltage region and a low voltage region, respectively.

Figure 7:
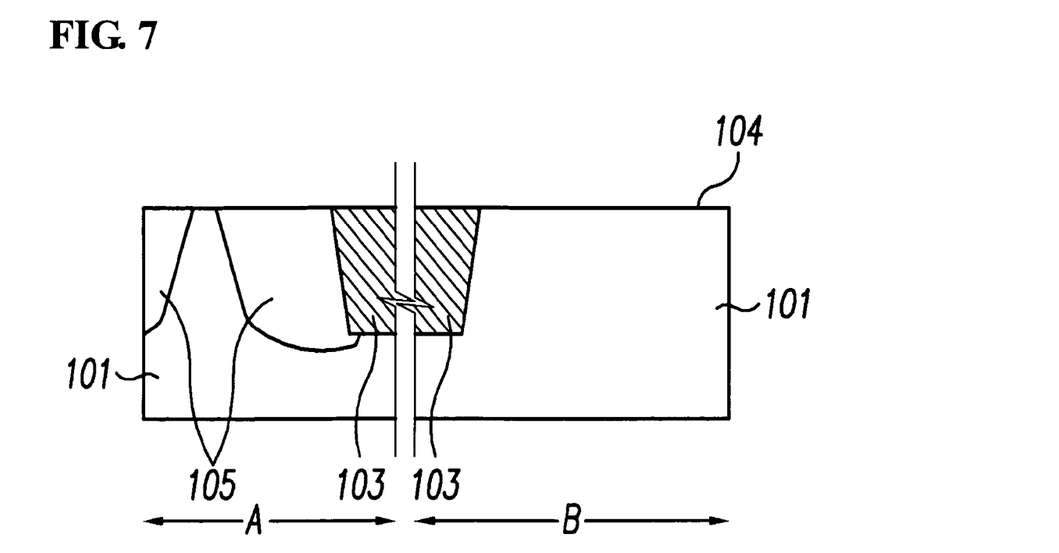
FIGS. 7 to 11 are cross-sectional views showing a method of fabricating a semiconductor device having a high voltage MOS transistor in accordance with an exemplary embodiment of the present invention.

Referring to FIG. 7, after a well (not shown) is formed in the substrate 101, the field area 103 is formed in the substrate 101. For example, to form the field area 103, a trench is formed in the substrate 101 by selective etching and filled with suitable insulating material deposited thereon. Then, the insulating material is planarized. While the field area 103 is formed, a thin first oxide layer 104 is simultaneously formed on the substrate 101. Next, the drift area 105 is formed in the substrate 101 of the high voltage region (A).

Figure 8:
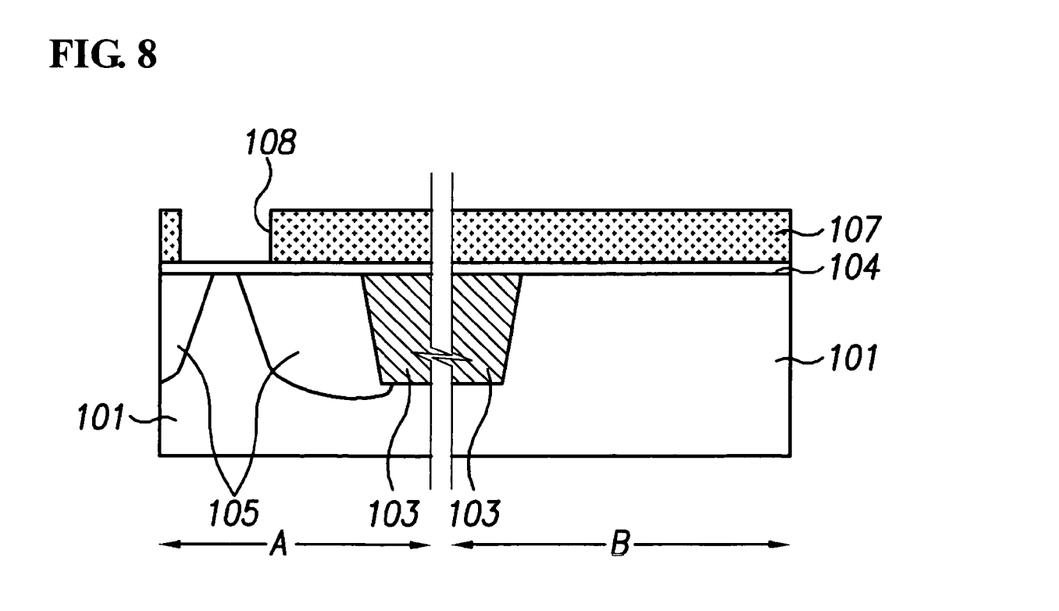

Next, referring to FIG. 8, a nitride layer 107 is formed on the substrate 101 and selectively etched to form an opening 108 for the gate electrode in the high voltage region (A).

Figure 9:
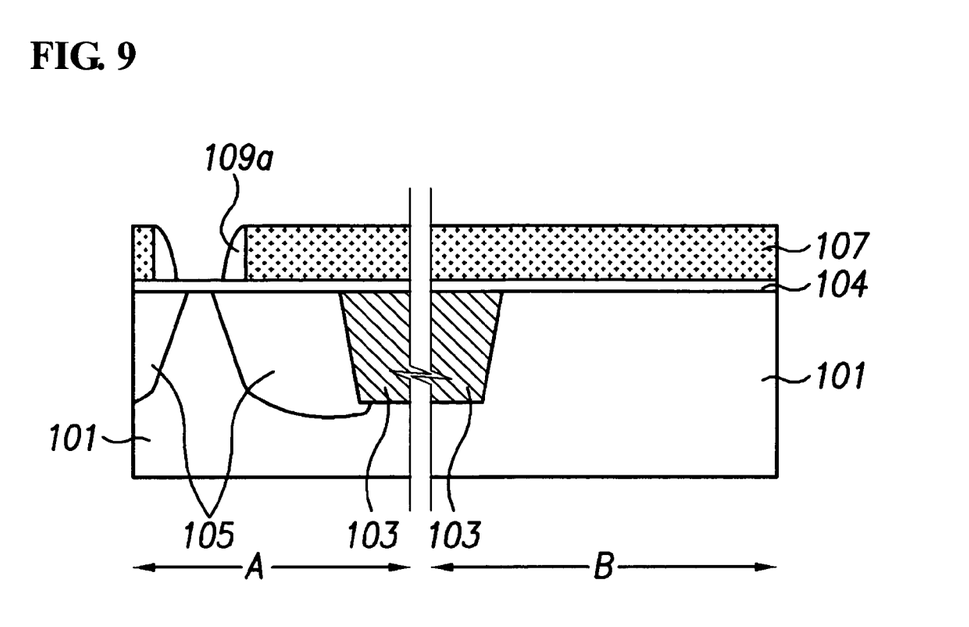

Next, referring to FIG. 9, a second oxide layer is fully deposited over the substrate 101 and anisotropically etched until the nitride layer 107 is exposed. Hence, the aforementioned thick portions 109a of the gate oxide layer are formed in the shape of spacers on sidewalls of the opening 108.

Figure 10:
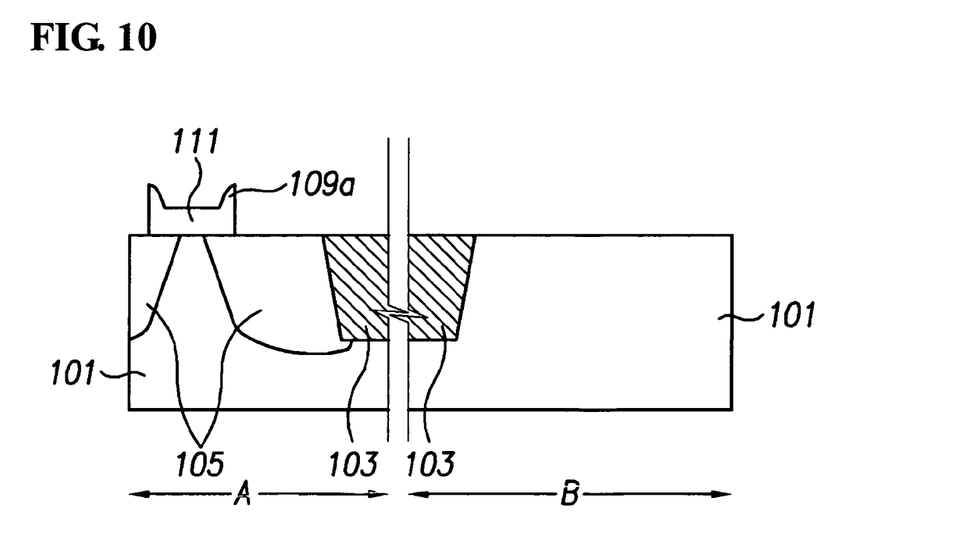

Next, referring to FIG. 10, the substrate 101 is subjected to thermal oxidation, and thereby the first gate oxide layer 111 is formed on the substrate 101 in the opening 108. For example, the first gate oxide layer 111 can be formed at a thickness of 500~1500 Å. Thereafter, the nitride layer 107 and the first oxide layer 104 are completely removed.

Figure 11:
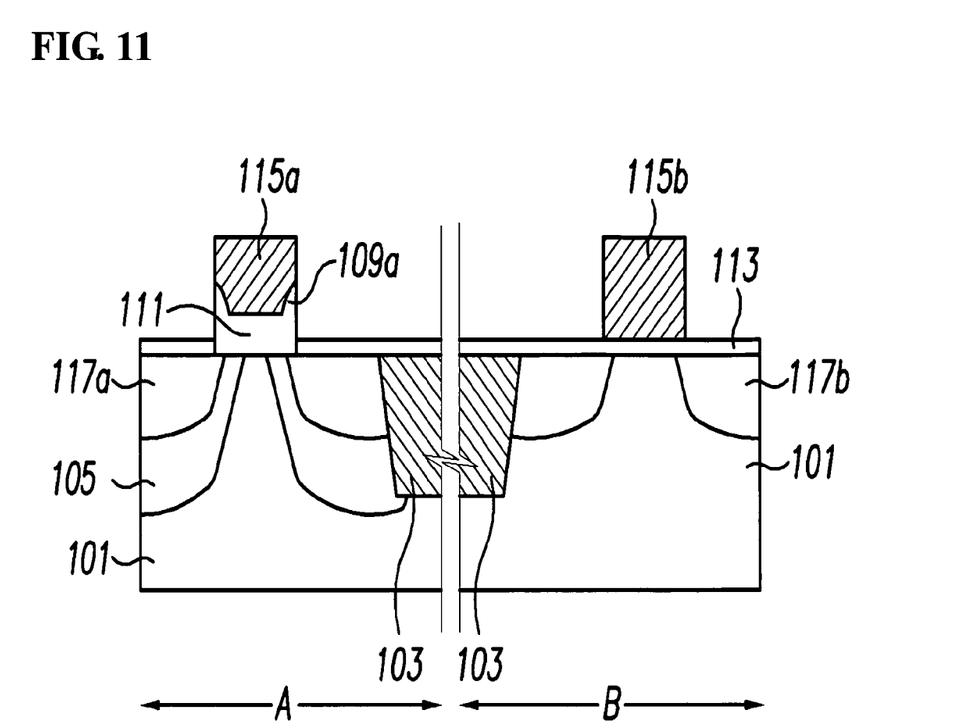

Next, referring to FIG. 11, a second gate oxide layer 113 and a gate conductive layer are sequentially formed over the substrate 101. The second gate oxide layer 113 has a relatively thinner thickness, for example, 50~300 Å, in comparison with the first gate oxide layer 111. Then, the gate conductive layer is selectively etched, so the gate electrodes 115a and 115b are respectively formed in the high voltage region (A) and the low voltage region (B).

Next, by using typical technique, the source/drain 117a and 117b are formed around the gate electrodes 115a and 115b in the active area of the substrate 101.

As discussed above, the thick portions of the first gate electrode in the high voltage region allow an increase in breakdown between the gate electrode and the drain. Additionally, the method of the invention becomes simpler since it does not require a process of partially removing a gate oxide layer, for a shallow ion implantation, in the high voltage region.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of fabricating a semiconductor device, the method comprising:

forming a field area in a semiconductor substrate so as to define an active area in a high voltage region and a low voltage region;

forming a nitride layer on the substrate, having an opening in the high voltage region;

depositing an oxide layer over the substrate;

anisotropically etching the oxide layer such that the oxide layer remains only on sidewalls of the opening;

forming a first gate oxide layer on the substrate in the opening;

removing the nitride layer;

forming a second gate oxide layer over the substrate such that the second gate oxide layer has a relatively thinner thickness than the first gate oxide layer;

forming gate electrodes in the high voltage region and the low voltage region; and forming source/drain around the gate electrodes in the active area of the substrate.

2. The method of claim 1, wherein the first gate oxide layer has a thickness of 500~1500 Å and the second gate oxide layer has a thickness of 50~300 Å.

3. The method of claim 1, further comprising:
after the forming of the field area, forming a drift area in the substrate of the high voltage region.

* * * * *